United States Patent
Cok et al.

(10) Patent No.: US 7,091,523 B2
(45) Date of Patent: Aug. 15, 2006

(54) COLOR OLED DEVICE HAVING IMPROVED PERFORMANCE

(75) Inventors: Ronald S. Cok, Rochester, NY (US); Michael E. Miller, Honeoye Falls, NY (US)

(73) Assignee: Eastman Kodak Company, Rochester, NY (US)

( * ) Notice: Subject to any disclaimer, the term of this patent is extended or adjusted under 35 U.S.C. 154(b) by 97 days.

(21) Appl. No.: 10/845,038

(22) Filed: May 13, 2004

(65) Prior Publication Data

US 2005/0258429 A1  Nov. 24, 2005

(51) Int. Cl.
  *H01L 27/15*  (2006.01)
(52) U.S. Cl. .......................... 257/79; 257/89
(58) Field of Classification Search ................ 257/98, 257/103, 89, 79; 315/169.3; 313/500, 504, 313/506, 113; 345/589
See application file for complete search history.

(56) References Cited

U.S. PATENT DOCUMENTS

| | | | |
|---|---|---|---|
| 6,570,584 B1 | 5/2003 | Cok et al. | |
| 6,693,611 B1 | 2/2004 | Burroughes | |
| 6,919,681 B1 * | 7/2005 | Cok et al. ................ | 313/500 |
| 2002/0036463 A1 | 3/2002 | Yoneda et al. | |
| 2002/0191130 A1 | 12/2002 | Liang et al. | |
| 2003/0011613 A1 | 1/2003 | Booth, Jr. | |
| 2004/0195963 A1 * | 10/2004 | Choi et al. ................ | 313/504 |

FOREIGN PATENT DOCUMENTS

| | | |
|---|---|---|
| EP | 1 187 235 | 3/2002 |
| WO | WO 2004/036535 | 4/2004 |

* cited by examiner

*Primary Examiner*—Howard Weiss
*Assistant Examiner*—(Vikki) Hoa B. Trinh
(74) *Attorney, Agent, or Firm*—Andrew J. Anderson

(57) ABSTRACT

A color OLED device is described having one or more pixels, at least one pixel comprising: four or more light-emitting elements, each light-emitting element comprising one or more layers of electroluminescent organic material producing a broadband light having a variable frequency-dependent luminous efficacy emission spectrum, and each light-emitting element further comprising a filter for filtering the broadband light and emitting a different color of light; wherein the different colors of light emitted by three of the light-emitting elements specify a first color gamut of the OLED device, and an additional one or more of the light-emitting elements emit at least one additional different color of light and wherein the frequency range of the filter of the additional light emitting element is matched to a portion of the broadband light frequency range having a radiant intensity greater than the radiant intensity of the frequency range of at least one of the filters of the three light-emitting elements specifying the first color gamut of the OLED device, and the additional one or more light emitting elements having luminous efficiency greater than that of at least one of the three light emitting elements specifying the first color gamut.

26 Claims, 2 Drawing Sheets

COLOR OLED DEVICE HAVING IMPROVED PERFORMANCE

FIELD OF THE INVENTION

The present invention relates to organic light emitting diode (OLED), full color display devices and, more particularly, to OLED color displays with improved gamut, power efficiency, and lifetime.

BACKGROUND OF THE INVENTION

Color, digital image display devices are well known and are based upon a variety of technologies such as cathode ray tubes, liquid crystal and solid-state light emitters such as Organic Light Emitting Diodes (OLEDs). In a common OLED color display device a pixel includes red, green, and blue colored OLEDs. By combining the illumination from each of these three OLEDs in an additive color system, a full-color display having a wide variety of colors can be achieved.

OLEDs may be used to generate color directly using organic materials that are doped to emit energy in desired portions of the electromagnetic spectrum. However, the known red and blue emissive materials are not particularly power efficient. In fact, broad bandwidth (white appearing) materials are known that have power efficiencies that are high enough by comparison to narrow bandwidth materials to produce a comparably power efficient OLED display by placing color filters over a broad bandwidth emissive material. Therefore, it is known in the art to produce OLED displays by building a display using an array of white-emitting OLEDs and placing color filters over the OLEDs to achieve red, green and blue light emitting elements in each pixel. It is also known in the art to effectively create color filters using optical effects, such as microcavities, to amplify light emission within the spectrum.

White-light emitting OLED devices that are known in the art are typically formed by doping multiple emitting layers such that each doped layer produces light within a specific spectral frequency band. White-light emitting devices formed from three individual emitting layers, e.g., are known in the art and can be produced by doping individual layers to produce spectral peaks in the red, green and blue portions of the spectrum. These devices have the advantage that the spectral emission of the white-light emitting devices can be matched to the peaks in the spectral transmission function of the red, green, and blue color filters typically used with white-light emitting devices, which optimizes the efficiency of the overall device. However, these devices require significantly more manufacturing steps than would be required if a white material can be formed by doping only two emissive layers as each doped emission layer is typically formed by applying multiple coating steps, including a host, dopant, an optional co-dopant and an optional connecting layer.

It is also known that three-color devices can be produced by creating a white-light emitting OLED material from only two doped layers. This reduction in the number of doped light emission layers significantly reduces the manufacturing complexity of the OLED display device. In white-light emitting OLED structures that are formed from two doped layers, one of these layers typically produces one or more broad peaks that emit cyan or yellow light. In such devices, the yellow peak provides energy to both the green and red light emitting elements and the cyan peak provides energy to the blue and green light emitting elements. Unfortunately, in these devices, the peak in the spectral energy distribution for the cyan or yellow light emitting layers can not be matched to the peak in the spectral transmission function for the color filters. For this reason, much of the energy emitted by the device is absorbed by the color filters rather than being transmitted to the observer, resulting in a display device with lower energy efficiency, particularly when narrow-band color filters are employed in order to create a display device with good color saturation and a large color gamut volume.

In a typical, prior-art OLED display, it is known that the luminance of the red, green, and blue OLEDs increase as current density delivered to the OLED is increased. Therefore, to increase the luminance of the display, one must increase the current delivered to an OLED with a given area. Unfortunately, increasing the current density used to drive an OLED not only increases the power required to drive the OLED but also reduces the lifetime of the OLED since the lifetime of an OLED emitter, as is known in the prior art, depends on the total current driven through the OLED emitter. Therefore, increasing the luminance of an OLED display not only increases the power needed to drive the OLED display device but can significantly reduce the lifetime of the OLED display device.

Traditionally, display devices have been constructed from a triad of red, green, and blue light emitting elements that, together, form a pixel and define a color gamut. The peak wavelengths of these light emitting elements will typically be in the short wavelength portion of the visible spectrum for blue, the middle wavelength portion of the visible spectrum for green, and the long wavelength portion of the visible spectrum for red. Given that the relative radiant efficiency of these light emitting elements are typically similar and the fact that the eye is most sensitive to energy in the middle wavelength portion of the visible spectrum, the green light emitting element will typically have significantly higher luminance efficiency than the red or blue light emitting elements.

While one goal when designing an OLED display device is to minimize the power consumption by maximizing the efficiency of each OLED, a competing goal is to maximize the color gamut of a display device. To improve the color gamut of the display device, the peak wavelength of the blue light emitting element will typically be reduced, providing energy that is even shorter in wavelength and further reducing the eye's sensitivity to the radiant energy provided by the light emitting element. Similarly, to increase the color gamut, the peak wavelength of the red light emitting element must be increased, producing energy that is even longer in wavelength and further reducing the eye's sensitivity to the radiant energy provided by the light emitting element. For this reason, the goals of providing increased color gamut and reduced power consumption typically compete with one another.

Another important factor when designing a display device is that many of the colors that must be produced will be neutral or desaturated. That is, these colors will be at or near the white point of the display. For example, it is known that the predominant color on many graphic displays is white. This includes the backgrounds in many popular applications and operating systems. Additionally, pictorial images tend to be composed of neutral or desaturated colors.

Therefore, to decrease the power consumption of a display device under typical use conditions, it is important that colors near the white point of the display device consume as little power as possible. However, in a typical three-color display device, white and desaturated colors are produced by the addition of luminance from the red, green, and blue light emitting elements. Since the red and blue light emitting elements typically have relatively low luminance efficiency, as discussed earlier, the power consumption of the display device will be near its maximum when displaying white or a desaturated color.

However, it is possible to utilize an additional light emitting element with a higher luminance efficiency than at least one of the light emitting elements. U.S. Pat. No. 6,693,611 by Burroughes, Feb. 17, 2004 as well as U.S. Patent Application 2003/0011613 by Booth, Jan. 16, 2003 describe a display device with red, green, blue and cyan light emitting elements. These disclosures discuss the fact that blue light emitting elements typically have a lower luminance efficiency than a cyan emitter due to the fact that the eye is more sensitive to light that is emitted in the spectral frequencies that must be used to create cyan light than to light that is emitted in the spectral frequencies that are used to create blue light. However, neither of these references discuss OLED display devices that are constructed from white materials with color filters to create light emission for either color, nor do they discuss any reason why the radiant efficiency of the materials used to create a cyan light emitting element may be higher than the radiant efficiency of the materials used to create a blue light emitting element.

OLED display devices having other than red, green, and blue light emitting elements have also been discussed by others. For example, U.S. Pat. No. 6,570,584 by Cok, et al., May 27, 2003 describes OLED display devices having an additional cyan, yellow, and or magenta OLEDs that are utilized to increase the color gamut of the display device. Cok et al. does not discuss the formation of this display device from a white emitting material that is filtered by color filters to produce an OLED display device.

U.S. Patent Application 2002/0191130 by Liang et al, Dec. 19, 2002 discusses an OLED display device employing pairs of complementary colors. Once again, this patent application does not discuss the formation of this display device from a white-emitting material that is filtered by color filters to produces an OLED display device.

There is a need, therefore, for an improved color OLED display device enabling improved power efficiency and/or lifetime that is formed from a white-light emitting layer and a means for selectively emitting light.

SUMMARY OF THE INVENTION

A color OLED device has one or more pixels, at least one pixel comprising: four or more light-emitting elements, each light-emitting element comprising one or more layers of electroluminescent organic material producing a broadband light having a variable frequency-dependent luminous efficacy emission spectrum, and each light-emitting element further comprising a filter for filtering the broadband light and emitting a different color of light; wherein the different colors of light emitted by three of the light-emitting elements specify a first color gamut of the OLED device, and an additional one or more of the light-emitting elements emit at least one additional different color of light and wherein the frequency range of the filter of the additional light emitting element is matched to a portion of the broadband light frequency range having a radiant intensity greater than the radiant intensity of the frequency range of at least one of the filters of the three light-emitting elements specifying the first color gamut of the OLED device, and the additional one or more light emitting elements having luminous efficiency greater than that of at least one of the three light emitting elements specifying the first color gamut.

ADVANTAGES

In various embodiments, the invention enables OLED four-color display systems using common broadband light emitting layers that allow improved power efficiency and display lifetime without decreasing the luminance of the display. In certain embodiments, color gamut may also be expanded.

DETAILED DESCRIPTION OF THE INVENTION

The present invention is directed to a color OLED device having one or more pixels, at least one pixel comprising four or more light-emitting elements, each light-emitting element comprising one or more layers of electroluminescent organic material producing a broadband light having a variable frequency-dependent luminous efficacy emission spectrum, and each light-emitting element further comprising a filter for filtering the broadband light and emitting a different color of light. As is known, luminous efficacy of a light source is dependent upon the radiant emission of the light source in combination with the response sensitivity of the human visual system. In the present invention, the different colors of light emitted by three of the light-emitting elements specify a first color gamut of the OLED device, and an additional one or more of the light-emitting elements emit at least one additional different color of light, and the frequency range of the filter of the additional light emitting element is matched to a portion of the broadband light frequency range having a radiant intensity greater than the radiant intensity of the frequency range of at least one of the filters of the three light-emitting elements specifying the first color gamut of the OLED device, and the additional one or more light emitting elements having luminous efficiency greater than that of at least one of the three light emitting elements specifying the first color gamut.

Figure 1:
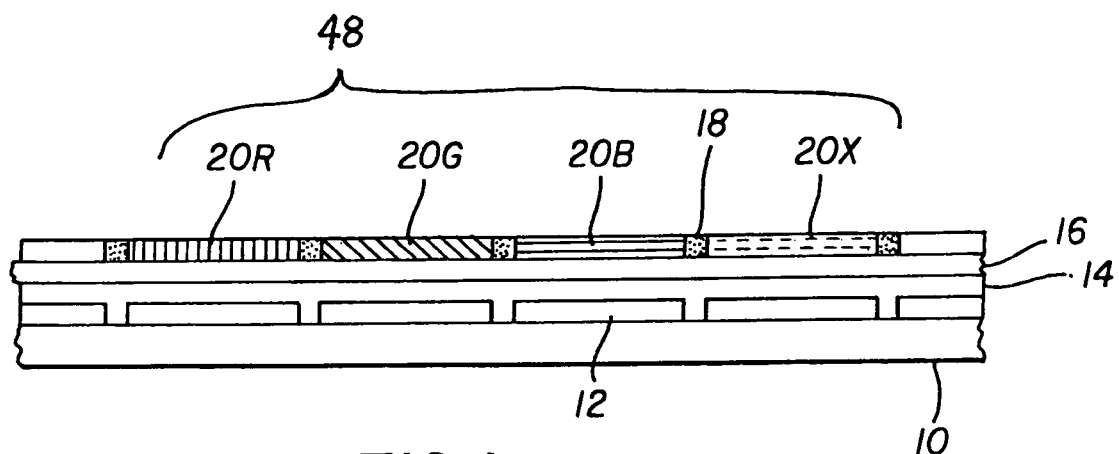
FIG. 1 is a schematic side view of a color OLED device according to one embodiment of the present invention.

Referring to FIG. 1, a portion of a color OLED device having light emitting elements is shown. In FIG. 1, a substrate 10 has a plurality of first electrodes 12, each associated with individual light-emitting elements. Located over the first electrodes 12 is a broadband OLED light emitter 14 made of one or more layers of electroluminescent organic material. This broadband OLED light emitter 14 is common to all of the light emitting elements and has a variable frequency-dependent luminous efficacy. Such a common emitter uses one set of unpatterned materials and is preferred to reduce manufacturing costs as opposed to the deposition of a plurality of patterned material sets. The broadband OLED light emitter 14 may be further composed of multiple layers of organic materials, for example including hole injection layers, hole transport layers, emissive layers, electron transport layers, and electron injection layers, as is known in the prior art. The OLED light emitter 14 used in the present invention is a broadband light emitter. As used herein, a broadband light emitter emits light across most of the visible spectrum.

Located over the broadband OLED light emitter 14 are one or more second electrodes 16. A common electrode may be used, as shown, to reduce manufacturing costs for active-matrix devices. Alternatively, separate electrodes may be used in passive- and active-matrix devices. Each light-emitting element has a filter 20R, 20G, 20B, 20X for filtering the light emitted from the broadband OLED light emitter 14. The four light emitting elements with filters 20R, 20G, 20B, 20X together comprise pixel a 48. All of the light-emitting elements may be controlled by the first and second electrodes 12 and 16. Black matrix materials 18 that absorb all visible wavelengths ma be used between the filters in non-light-emissive areas to absorb ambient radiation and improve the contrast of the device.

As shown in the embodiment of FIG. 1, filters 20R, 20G, 20B, 20X may be a conventional color filter such as is used in the liquid crystal display industry composed of light-absorbent material that only permits the desired color of light to pass through. In one alternative embodiment, filters may be used wherein color filtering is provided by the optical interference of layers of dielectric materials having various thicknesses and optical indices. In another alternative embodiment, filter may be used wherein color filtering is provided by optical interference within an optical cavity defined by reflective or partially reflective first and second electrodes. In another alternative embodiment, filters maybe used wherein color filtering is provided by secondary light emitters of colored light stimulated by the broad-band light emitter to form color change media. In the latter embodiment, the frequency range over which the color change medium of the additional element is sensitive is matched to a portion of the broadband light frequency range having a radiant intensity greater than the radiant intensity of the frequency range over which at least one of the first gamut specifying color change media is sensitive. Other color filtering techniques applicable to broadband light filtering may be utilized as are known to those skilled in the art and are included in the present invention. Combinations of filters may also be provided, for example a color absorbent material may be provided together with an optical cavity to further control the color of the light output by a light-emitting element.

At least three of the plurality of light-emitting elements in a pixel of an OLED device in accordance with the invention emit colored light that define a first color gamut for the OLED device. Each of the light-emitting elements has a filter for restricting the light output of the emitter to one of the colors of light. In the embodiment shown in FIG. 1, the first color gamut defining filters are red 20R, green 20G, and blue 20B. These three colors may be obtained by filtering the same broadband light emitted by the common OLED emitter materials. The color OLED device of the present invention also includes at least one, but possibly more, additional light-emitting elements having an additional filter 20X for emitting an additional color of light.

Figure 2:
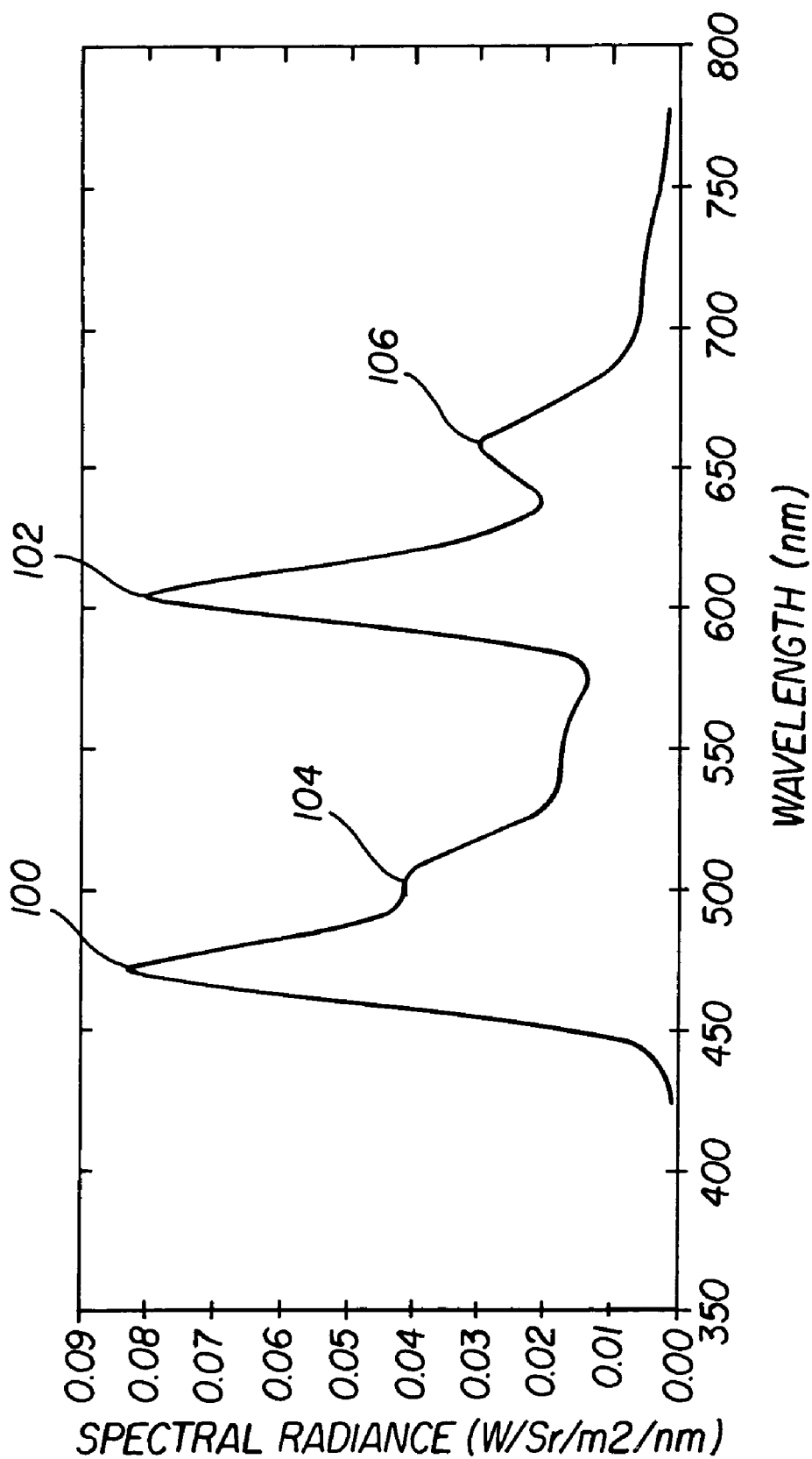
FIG. 2 is a graph showing the relationship of spectral radiance to wavelength for a broadband OLED emitter.

The present invention is directed towards the use of a broadband OLED light emitter having a variable frequency-dependent luminous efficacy emission spectrum. Such emission spectrum is typically obtained when employing two (or more) differently colored light emitting OLED materials in combination to form a broadband light emitter. Referring to FIG. 2, e.g., the light output from a broadband OLED light emitter constructed by applicant is illustrated. In FIG. 2, the spectral radiance of the broadband OLED light emitter is plotted against the wavelength of the light emitted. As can be seen from an examination of the plot, the amount of radiation emitted at various wavelengths is different. In this example, more radiation is emitted between wavelengths of 450 to 500 nm, with a first peak 100 indicated and between 580 and 640 nm, with a second peak 102 indicated. Smaller bands 104 and 106 of a relatively greater amount of emitted energy are shown from 500 to 550 nm and from 640 to 680 nm.

Depending upon the specific combination of OLED materials employed, the bands in the emission spectrum of a broadband emitter with higher emitted energy may or may not correspond with the light colors desired for specifying the gamut of a display device. In certain embodiments, e.g., a preferred gamut will be formed from spectral components that have a deep blue spectral peak (typically <450 nm), a deep red spectral peak (typically >700 nm), and a green spectral peak (typically in the region between 500 and 600 nm). As can be seen from FIG. 2, none of the light emitted at these frequencies will be very intense compared to the peaks at 100, 102, 104, and 106. If the blue color is defined by a bandpass filter having a range from 400 to 450 nm, the red color is defined by a bandpass filter having a range from 700 to 750 nm, and the green color by a bandpass filter having a range from 500 to 540 nm, OLED device employing such broadband emitter to produce only blue, red and green light-emitting elements will be relatively inefficient (i.e., having a lower radiant efficiency than a light emitting element including a filter that transmits the frequencies of energy that includes the spectral peaks) because the broadband OLED light emitter is relatively inefficient at producing light in those wavelength ranges. While filters may still be used to obtain light corresponding to the desired gamut specifying colors, much of the light of the broadband emitter will be wasted, resulting in poor power efficiency for the device.

According to the present invention, an OLED device having a broadband light emitter may have both a good gamut and good power efficiency by combining a relatively inefficient first color gamut-defining light-emitting element set with one or more relatively more efficient additional color light-emitting elements. In the embodiment of FIG. 1, the additional light-emitting element filter 20X is selected to have a frequency range matched to a portion of the broadband OLED light emitter 14 frequency range having a radiant intensity greater than the radiant intensity of the frequency range of at least one of the 20R, 20G, 20B filters of the OLED device. When using a broadband emitter as depicted in FIG. 2, e.g., by adding at least one additional colored OLED light-emitting element having a bandpass filter where the frequency range of the filter is matched to a portion of the broadband light frequency range having a radiant intensity greater than the radiant intensity of the frequency range of at least one of the above described blue, red, or green filters (e.g., a bandpass filter with a range of 580 to 640 nm or a bandpass filter with a range of 450 to 500 nm, or by adding two additional light-emitting elements in those ranges), light may be efficiently output from the OLED device. Because the broadband OLED light emitter emits relatively more light in this wavelength range, the OLED device will be very efficient when emitting light through this additional light-emitting element. In accordance with a specific embodiment, the frequency range of the filter of the additional light emitting element may be matched to specifically correspond directly to a local maximum of the broadband light emission spectrum. While the additional color light-emitting element filter may be a bandpass filter passing energy within a selected specific frequency range, it may also be a high-pass or low-pass filter that transmits a broader frequency range including a relatively high efficiency emission spectral peak of the broadband emitter emission spectrum. It is also possible that an additional light-emitting element may emit light at wavelengths that are also emitted by another light emitting element; that is, the output spectra may overlap or one may even include the other.

Figure 3:
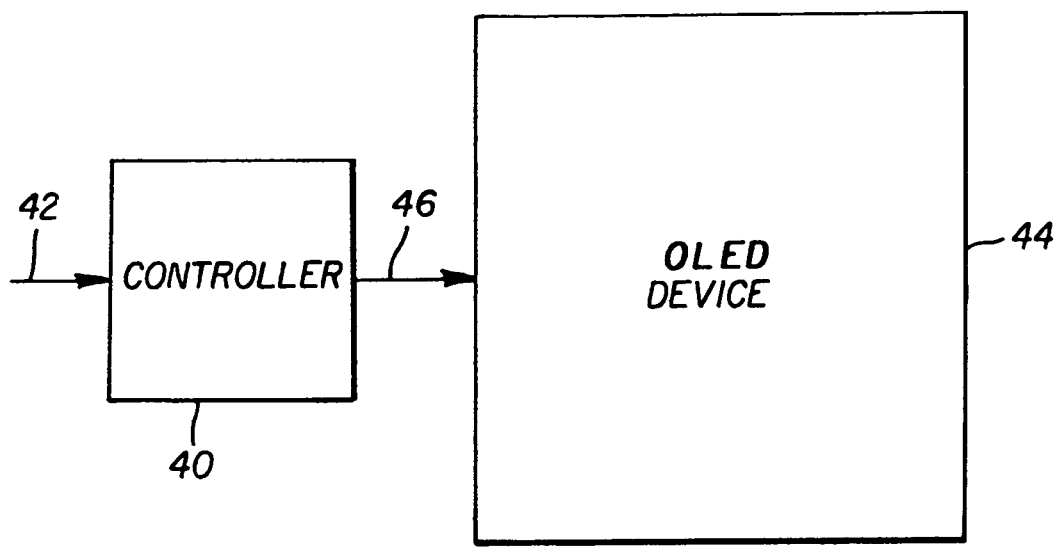
FIG. 3 is a diagram illustrating the components of a display system incorporating the color OLED device according to one embodiment of the present invention.

Referring to FIG. 3, in operation, a controller 40 for the OLED device 44 receives a conventional three-color signal 42 describing an image to be shown on the OLED device 44. The controller 40 converts the three-color signal 42 to converted four-or-more color signal 46 that are applied to the OLED device 44. The converted color signal 46 defines which light-emitting elements of which pixels 48 in the OLED device are to be powered to what extent by electrodes 12 and 16. Upon receipt of the converted color signal 46, the OLED device 44 displays the image data. Integrated circuits using methods well-known in the art may be used to construct the controller 40.

There are a variety of ways in which the conventional three-color signal 42 can be converted to a four-or -more color signal 46. In an extreme case, the converted signal 46 may drive only the gamut-defining light-emitting elements. In this case, a very good gamut may be achieved but, as illustrated by FIG. 2, efficiency may be very low. However, if the converted signal 46 utilizes the relatively efficient additional light-emitting element, efficiency will be improved. In most applications, desaturated primary colors (e.g., reds, greens, and blues) predominate. Hence, the use of a relatively efficient light-emitting element that does not emit red, green, or blue light can provide power savings by providing light in the place of the gamut-defining light-emitting elements. Specific methods to convert three-color signals to four-or -more color signals are described, e.g., in copending, commonly assigned U.S. Ser. No. 10/607,374 (filed Jun. 26, 2003), Ser. No. 10/703,748 (filed Nov. 7, 2003), and Ser. No. 10/812,787 (filed Mar. 29, 2004), the disclosures of which are hereby incorporated by reference.

The extent to which the additional light-emitting elements may be used in the place of one of the gamut-defining light-emitting elements will depend on the image content to be displayed and the color of the light emitted by the additional light-emitting element. For example, if the additional light-emitting element emits cyan light, it may often be used to reproduce colors having blue and green components more efficiently than if the blue and green light-emitting elements were used. Likewise, if the additional light-emitting element emits yellow light, it may often be used to reproduce colors having red and green components more efficiently than if the red and green light-emitting elements were used. If two additional light-emitting elements are used, for example emitting yellow and cyan light respectively, the yellow and cyan light-emitting elements may be used to reproduce most of the light for many, perhaps most, of the colors to be reproduced by the OLED display for a given application and do so much more efficiently than if the red, green, and blue light emitters were used alone. At the same time, the relatively inefficient red, green, and blue light-emitting elements provide a good gamut for those occasions when saturated primary colors are required.

It should be noted that while the particular embodiments discussed herein are discussed particularly for a display device having three OLEDs that define the gamut boundary of the display and one additional OLED that has a higher-power efficiency or lifetime, these same concepts may be employed in a similar display device having more than three OLEDs that define the gamut. Additionally, these same concepts may apply to a display device having more than one additional OLED with a higher-power efficiency or lifetime.

In one embodiment, the additional light-emitting element may emit light within a first gamut defined by the other light-emitting elements. Alternatively, in a second embodiment, the additional light-emitting element may emit light outside the gamut defined by the other light-emitting elements. In this case, the additional light-emitting element, in combination with the first gamut defining elements, will actually form an expanded second gamut of the OLED device. Hence, the present invention enables both power-saving and an extensive color gamut by providing efficient light-emitting elements and good gamut-defining light-emitting elements.

Individual light-emitting elements employed in the present invention may be of equal or different sizes. Because the efficiency of the light-emitting elements depends on the variability of the broadband OLED light emitter and the filter used to produce the colored light, the different light-emitting elements will have different efficiencies. Moreover, the usage of each light-emitting element may vary depending on the application of the color OLED device. Hence, the current density for each light-emitting element will differ, leading to differential aging of the materials of the light-emitting element. This differential aging can be corrected, to some extent, by providing light-emitting elements of different sizes. For example, if a blue light-emitting element emits light much less efficiently than a red light-emitting element, it might be made larger to reduce the current density needed to produce an equivalent intensity of blue light. Additionally, the size of the light emitting element may be varied based on the expected use of the light emitting element. For example, if a cyan light emitting element is provided that will often replace the emission often created by the blue and green light emitting elements, the blue and green light emitting elements may be smaller in size since they are not required to be used as often.

It is also possible to provide some pixels within an OLED device that do not have additional light-emitting elements. For example, the first color-gamut defining light-emitting elements may be provided conventionally at one resolution while pixels having additional, relatively more efficient light-emitting elements may be provided at a lower resolution. Likewise, the color-gamut defining light-emitting elements may be provided at different spatial frequencies to match the response of the human visual system. For example, more green, yellow or cyan light-emitting elements may be provided than red or blue light-emitting elements.

The present invention can be employed in most top- or bottom-emitting OLED device configurations. These include simple structures comprising a separate anode and cathode per OLED light emitting element and more complex structures, such as passive matrix displays having orthogonal arrays of anodes and cathodes to form pixels, and active matrix displays where each pixel is controlled independently, for example, with a thin film transistor (TFT). As is well known in the art, OLED devices and light emitting layers include multiple organic layers, including hole and electron transporting and injecting layers, and emissive layers. Such configurations are included within this invention.

If a top-emitting structure is preferred, the second electrode 16 must be at least partially transmissive while the first electrode 12 may be completely opaque and reflective. Alternatively, if a bottom-emitting structure is preferred, the first electrode 14 must be at least partially transmissive while the second electrode 16 may be completely opaque and reflective.

In an active-matrix configuration, additional circuitry is integrated on the substrate 10 to provide local control of the light-emitting elements. In a passive-matrix configuration, busses are used to connect the electrodes to external drivers. In such a configuration, the second electrode 16 may not be connected in common as is shown in FIG. 1.

In a preferred embodiment, the invention is employed in a device that includes Organic Light Emitting Diodes (OLEDs) which are composed of small molecule OLEDs as disclosed in but not limited to U.S. Pat. No. 4,769,292, issued Sep. 6, 1988 to Tang et al. and U.S. Pat. No. 5,061,569, issued Oct. 29, 1991 to VanSlyke et al. Alternatively, polymeric OLED materials may be employed. Many combinations and variations of organic light emitting displays can be used to fabricate such a device.

The invention has been described in detail with particular reference to certain preferred embodiments thereof, but it will be understood that variations and modifications can be effected within the spirit and scope of the invention.

PARTS LIST 10 substrate
12 first electrode
14 broadband OLED light emitter
16 second electrode
18 black matrix
20R red color filter
20G green color filter
20B blue color filter
20X additional color filter
40 controller
42 input signal
44 OLED device
46 converted signal
48 pixel
100 peak
102 peak
104 peak
106 peak

What is claimed is:

1. A color OLED device having one or more pixels, at least one pixel comprising: four or more light-emitting elements, each light-emitting element comprising one or more layers of electroluminescent organic material producing a broadband light having a variable frequency-dependent luminous efficacy emission spectrum, and each light-emitting element further comprising a different color filter having a frequency range matched to a portion of the broadband light frequency range for differentially filtering the broadband light and emitting a different color of light;

wherein the different colors of light emitted by three of the light-emitting elements specify a first color gamut of the OLED device, and an additional one or more of the light-emitting elements emit at least one additional different color of light and wherein the frequency range of the color filter of the additional light emitting element is matched to a portion of the broadband light frequency range having a radiant intensity greater than the radiant intensity of the portion of the broadband light frequency range that is matched to the frequency range of at least one of the color filters of the three light-emitting elements specifying the first color gamut of the OLED device, and the additional one or more light emitting elements having luminous efficiency greater than that of at least one of the three light emitting elements specifying the first color gamut.

2. The color OLED device claimed in claim 1 wherein the additional color is within the first color gamut.

3. The color OLED device claimed in claim 1 wherein the additional color is outside the first color gamut, and in combination with the light emitted by the three light-emitting elements specifying the first color gamut specifies a second expanded color gamut.

4. The color OLED device claimed in claim 1 wherein the three colors of light specifying the first color gamut include red, green, and blue.

5. The color OLED device claimed in claim 1 wherein additional light-emitting element emits yellow light.

6. The color OLED device claimed in claim 1 wherein additional light-emitting element emits cyan light.

7. The color OLED device claimed in claim 1 wherein each pixel emits red, green, blue, and yellow.

8. The color OLED device claimed in claim 1 wherein each pixel emits red, green, blue, and cyan.

9. The color OLED device claimed in claim 1 wherein each pixel emits red, green, blue, yellow, and cyan.

10. The color OLED device claimed in claim 1, further comprising a controller for controlling the color OLED device.

11. The color OLED device claimed in claim 10, wherein the controller converts a three-color signal to a converted four-or-more color signal driving the color OLED display device.

12. The color OLED device claimed in claim 10, wherein the converted signal reduces the power usage or increases the lifetime of the color OLED device.

13. The color OLED device claimed in claim 1, wherein the light-emitting elements are of different sizes.

14. The color OLED device claimed in claim 1, wherein the frequency range of the light emitted by the additional light-emitting element overlaps at least some of the frequency range of the light emitted by one or more of the other light-emitting elements.

15. The color OLED device claimed in claim 1 wherein the filters are formed by light-absorbent materials through which the light from the broadband light-emitting electroluminescent organic material passes.

16. The color OLED device claimed in claim 1 wherein the filters are formed by dielectric stacks providing optical interference in light passing through the stacks.

17. The color OLED device claimed in claim 1 wherein the filters are formed by electrodes that are at least partially reflective and that form an optical cavity that filters the broadband light.

18. The color OLED device claimed in claim 1 wherein the filters are formed by secondary light emitters of colored light stimulated by the broadband light.

19. The color OLED device claimed in claim 1 wherein the filters are formed using a plurality of filtering techniques.

20. The OLED device in claim 1, wherein the OLED device is an active-matrix device.

21. The OLED device in claim 1, wherein the OLED device is a passive-matrix device.

22. The OLED device in claim 1, further comprising pixels without the additional light-emitting element.

23. The OLED device in claim 1, comprising pixels having a different number of light-emitting elements of different colors.

24. The OLED device in claim 1, wherein the frequency range of the filter of the additional light emitting element is matched to correspond to a local maximum of the broadband light emission spectrum.

25. The OLED device in claim 1, wherein each light-emitting element comprises only two light-emitting layers of electroluminescent organic material that in combination produce the broadband light having a variable frequency-dependent luminous efficacy emission spectrum.

26. The OLED device in claim 25, wherein the frequency range of the filter of the additional light emitting element is matched to correspond to a local maximum of the broadband light emission spectrum corresponding to the light emitted from one of the light-emitting layers of electroluminescent organic material.

* * * * *